United States Patent
Park

(10) Patent No.: US 8,236,685 B2
(45) Date of Patent: Aug. 7, 2012

(54) PHASE CHANGE MEMORY DEVICE HAVING MULTIPLE METAL SILICIDE LAYERS AND METHOD OF MANUFACTURING THE SAME

(75) Inventor: Nam Kyun Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 442 days.

(21) Appl. No.: 12/539,160

(22) Filed: Aug. 11, 2009

(65) Prior Publication Data

US 2010/0065804 A1    Mar. 18, 2010

(30) Foreign Application Priority Data

Sep. 18, 2008  (KR) .................. 10-2008-0091537

(51) Int. Cl.
*G11C 11/00*  (2006.01)
*H01L 45/00*  (2006.01)

(52) U.S. Cl. ........ 438/642; 438/649; 438/651; 438/900; 257/E45.002; 257/E21.04; 365/148; 365/163

(58) Field of Classification Search .................. 257/4, 5, 257/E45.002, E21.04; 438/95, 50, 54, 130, 438/900, 642, 649, 651; 365/148, 163
See application file for complete search history.

(56) References Cited

U.S. PATENT DOCUMENTS

| 2002/0098716 A1* | 7/2002 | Gonzalez et al. | ............. 438/797 |
| 2009/0039333 A1* | 2/2009 | Chang et al. | ....................... 257/4 |
| 2009/0114897 A1* | 5/2009 | Chang | ............................... 257/2 |
| 2009/0230376 A1* | 9/2009 | Ryoo et al. | ......................... 257/2 |

* cited by examiner

*Primary Examiner* — Evan Pert
*Assistant Examiner* — Scott Stowe
(74) *Attorney, Agent, or Firm* — Ladas & Parry LLP

(57) ABSTRACT

A phase change memory device having multiple metal silicide layers which enhances the current driving capability of switching elements and a method of manufacturing the same are presented. The device also includes switching elements, heaters, stack patterns, top electrodes, bit lines, word line contacts and word lines. The bottom of the switching elements are in electrical contact with the lower metal silicide layer and with an active area of silicon substrate. An upper metal silicide layer is interfaced between the top of the switching elements and the heaters. The stack patterns include phase change layers and top electrodes and are between the heaters and the top electrodes are in electrical contact with the top electrodes. The bit lines contact with the top electrode contacts. The word line contacts to the lower metal silicide film.

9 Claims, 6 Drawing Sheets

PHASE CHANGE MEMORY DEVICE HAVING MULTIPLE METAL SILICIDE LAYERS AND METHOD OF MANUFACTURING THE SAME

CROSS-REFERENCES TO RELATED APPLICATIONS

The present application claims priority per Korean patent Application Number 10-2008-0091537 filed on Sep. 18, 2008, which is incorporated by reference herein in its entirety.

BACKGROUND OF THE INVENTION

The present invention relates to a phase change memory device and a method of manufacturing the same, and, more particularly, to a phase change memory device, which enhances the current driving capability of switching elements, and to a method of manufacturing the same.

Recently, a considerable amount of research has been conducted in the hopes of developing novel memory devices that have simple configurations capable of achieving high levels of integration while retaining many if not all of the characteristics of present day non-volatile memory devices. One group of novel memory devices studied is the phase change memory devices.

Phase change memory devices are those types of memory devices that exploit a change in a physical property, e.g., usually resistance, which reversibly changes as a function of the particular phase of the phase change layer material. Phase change memory devices are usually constructed of a phase change material interposed between two opposing electrodes. Phase change materials are often those types of materials that reversibly change between an ordered crystalline solid state to a disordered amorphous solid state as a function of a rate of heating, cooling or annealing which is usually initiated by flowing an electrical current between two opposing electrodes. Digital information can be stored in these types of memory cells by measuring the magnitude of these variable physical properties, e.g., a variable resistance, which changes as a function of which state the phase change layer is in.

Development of the phase change memory device should also take into consideration the important factor that the electrical currents used to drive the phase changes, i.e., the programming currents, should be minimized. Accordingly, recent phase change memory devices include vertical PN diodes instead of transistors as cell switching elements. The reason for doing this is that vertical PN diodes have a higher current flow densities than those of transistors. Therefore use of vertical PN diodes in the design of phase change memory devices may reduce the programming current and the cell size, and thereby may be advantageously applied to furthering higher integration of the phase change memory device.

It should also be noted that the current driving properties of the PN diodes are affected by the purity of the material properties of the diodes and peripheral resistance values of the diodes. Typically, peripheral resistance affecting the current driving properties of the PN diodes may include resistance of a silicon substrate and word line contact resistance.

Accordingly, to manufacture the phase change memory devices that use PN diodes in their design it is very important to control the peripheral resistance of the diodes which can adversely affect, i.e., reduce, the current driving performance of the PN diodes. Accordingly, in order to reduce the peripheral resistance of the PN diodes, when the conventional phase change memory device is manufactured, an ion-implanting process for doping a silicon substrate with a dopant may be performed. However, the ion-implanting process has its physical limitations in terms that it can only reduce the resistance of the subsequent silicon substrate to about 90 Q or less.

SUMMARY OF THE INVENTION

Embodiments of the present invention provide a phase change memory device able to reduce peripheral resistance values of switching elements and a method of manufacturing the same.

Also, embodiments of the present invention provide a phase change memory device able to reduce resistance of a silicon substrate and a method of manufacturing the same.

In aspect of the present invention, a phase change memory device comprise a phase change memory device, comprising a silicon substrate having an active area, and a metal silicide film formed on a surface of the active area of the silicon substrate.

The metal silicide can comprise any number of metal suicides such as cobalt silicide ($CoSi_2$), a nickel silicide ($NiSi_2$), a palladium silicide ($PdSi_2$), a platinum silicide ($PtSi_2$), a tungsten silicide ($WSi_2$), molybdenum silicide ($MoSi_2$), zirconium silicide ($ZrSi_2$), ruthenium silicide ($RuSi_2$), rhenium silicide ($RhSi_2$), tantalum silicide ($TaSi_2$), copper silicide ($Cu_5Si$), vanadium silicide ($V_3Si$), iron silicide ($Fe_3Si$), manganese silicide ($Mn_3Si$), chromium silicide ($Cr_3Si$), uranium silicide ($U_3Si_2$), hafnium silicide (HfSi), tantalum silicide (TaSi), potassium silicide (KSi), rubidium silicide (RbSi), cesium silicide (CsSi), titanium silicide (TiSi), thallium silicide (ThSi), plutonium silicide (PuSi), calcium silicide (CaSi), strontium silicide (SrSi), yttrium silicide (YSi), and admixtures thereof. It is preferable that the metal silicide film comprises any one selected from the group consisting of a cobalt silicide ($CoSi_2$) film, a nickel silicide ($NiSi_2$) film, a platinum silicide ($PtSi_2$) film, a tungsten silicide ($WSi_2$) film, a molybdenum silicide ($MoSi_2$) film, a tantalum silicide ($TaSi_2$) film, a copper silicide ($Cu_5Si$) film, a vanadium silicide ($V_3Si$) film, an iron silicide ($Fe_3Si$) film, a manganese silicide ($Mn_3Si$) film, a chromium silicide ($Cr_3Si$) film, a uranium silicide ($U_3Si_2$) film, a hafnium silicide (HfSi) film, a tantalum silicide (TaSi) film, a potassium silicide (KSi) film, a rubidium silicide (RbSi) film, a cesium silicide (CsSi) film, a titanium silicide (TiSi) film, a zirconium silicide (ZrSi) film, a thallium silicide (ThSi) film, a plutonium silicide (PuSi) film, a calcium silicide (CaSi) film, a strontium silicide (SrSi) film, a yttrium silicide (YSi) film, and admixtures thereof.

In another aspect of the present invention, a phase change memory device comprises a silicon substrate having an active area and a metal silicide film formed on a surface of the active area; at least one switching elements formed to be in contact with the active area of the silicon substrate; a heater formed on the switching elements; a stack pattern of a phase change layer and an top electrode formed to be in contact with the heater; an top electrode contact formed on the top electrode; a bit line formed to be in contact with the top electrode contact; a first word line contact, a second word line contact and a third word line contact sequentially formed on the metal silicide film at each of both sides of the active area; and a word line formed to be in contact with the third word line contact.

An impurity area is formed in the active area.

The metal silicide film preferably comprises any one selected from the group consisting of a cobalt silicide ($CoSi_2$) film, a nickel silicide ($NiSi_2$) film, a platinum silicide ($PtSi_2$) film, a tungsten silicide ($WSi_2$) film, a molybdenum silicide ($MoSi_2$) film, a tantalum silicide ($TaSi_2$) film, a copper silicide ($Cu_5Si$) film, a vanadium silicide ($V_3Si$) film, an iron silicide ($Fe_3Si$) film, a manganese silicide ($Mn_3Si$) film, a chromium silicide ($Cr_3Si$) film, a uranium silicide ($U_3Si_2$)

film, a hafnium silicide (HfSi) film, a tantalum silicide (TaSi) film, a potassium silicide (KSi) film, a rubidium silicide (RbSi) film, a cesium silicide (CsSi) film, a titanium silicide (TiSi) film, a zirconium silicide (ZrSi) film, a thallium silicide (ThSi) film, a plutonium silicide (PuSi) film, a calcium silicide (CaSi) film, a strontium silicide (SrSi) film, a yttrium silicide (YSi) film, and admixtures thereof.

The switching elements comprises a vertical PN diode.

The number of the switching elements disposed within a single memory cell is about 8~24.

The heater preferably comprises any one selected from the group consisting of titanium nitride (TiN), silicon germanium (SiGe), titanium aluminum nitride (TiAlN), tungsten (W), titanium (Ti), molybdenum (Mo), Tantalum (Ta), platinum (Pt), titanium silicide (TiSi), Tantalum silicide (TaSi), titanium tungsten (TiW), titanium oxide nitride (TiON), titanium aluminum oxide nitride (TiAlON), tungsten oxide nitride (WON), tantalum oxide nitride (TaON), iridium oxide ($IrO_2$), and admixtures thereof. The heater material may also comprise a metal, allow, metallic oxide, metallic nitride, oxide electrode, conductance carbon compound, and admixture thereof.

The first word line contact is formed to be higher than the phase change layer.

The bit line is formed in a direction substantially perpendicular to a direction of the active area.

The word line is formed in a direction substantially the same as that of the active area.

In one aspect of the present invention, a method of forming a phase change layer comprises forming a metal silicide film on a surface of an active area of a silicon substrate; forming switching elements on the active area having the metal silicide film; forming heaters on the switching elements; forming stack patterns comprising a phase change layer and an top electrode on the heaters; forming top electrode contacts on the top electrodes; forming a bit line in contact with the top electrode contact; forming a first word line contact, a second word line contact and a third word line contact on the metal silicide film at each of both sides of the active area; and forming a word line in contact with the third word line contact.

Before the step forming the metal silicide film on the surface of the active area of the silicon substrate, the method may further comprise the step of conducting the active area to an impurity ion-implanting process.

The metal silicide film preferably comprises any one selected from the group consisting of a cobalt silicide ($CoSi_2$) film, a nickel silicide ($NiSi_2$) film, a platinum silicide ($PtSi_2$) film, a tungsten silicide ($WSi_2$) film, a molybdenum silicide ($MoSi_2$) film, a tantalum silicide ($TaSi_2$) film, a copper silicide ($Cu_5Si$) film, a vanadium silicide ($V_3Si$) film, an iron silicide ($Fe_3Si$) film, a manganese silicide ($Mn_3Si$) film, a chromium silicide ($Cr_3Si$) film, a uranium silicide ($U_3Si_2$) film, a hafnium silicide (HfSi) film, a tantalum silicide (TaSi) film, a potassium silicide (KSi) film, a rubidium silicide (RbSi) film, a cesium silicide (CsSi) film, a titanium silicide (TiSi) film, a zirconium silicide (ZrSi) film, a thallium silicide (ThSi) film, a plutonium silicide (PuSi) film, a calcium silicide (CaSi) film, a strontium silicide (SrSi) film, a yttrium silicide (YSi) film, and admixtures thereof.

The switching elements comprises vertical PN diodes.

A number of the switching elements disposed in a cell is preferably about 8~24.

Between the steps of forming the switching elements and forming the heater, a step of forming a metal silicide film on the switching elements is performed.

The metal silicide film may comprise any one selected from the group consisting of a cobalt silicide ($CoSi_2$) film, a nickel silicide ($NiSi_2$) film, a platinum silicide ($PtSi_2$) film, a tungsten silicide ($WSi_2$) film, a molybdenum silicide ($MoSi_2$) film, a tantalum silicide ($TaSi_2$) film, a copper silicide ($Cu_5Si$) film, a vanadium silicide ($V_3Si$) film, an iron silicide ($Fe_3Si$) film, a manganese silicide ($Mn_3Si$) film, a chromium silicide ($Cr_3Si$) film, a uranium silicide ($U_3Si_2$) film, a hafnium silicide (HfSi) film, a tantalum silicide (TaSi) film, a potassium silicide (KSi) film, a rubidium silicide (RbSi) film, a cesium silicide (CsSi) film, a titanium silicide (TiSi) film, a zirconium silicide (ZrSi) film, a thallium silicide (ThSi) film, a plutonium silicide (PuSi) film, a calcium silicide (CaSi) film, a strontium silicide (SrSi) film, a yttrium silicide (YSi) film, and admixtures thereof.

The heater may comprise any one selected from the group consisting of titanium nitride (TiN), silicon germanium (SiGe), titanium aluminum nitride (TiAlN), tungsten (W), titanium (Ti), molybdenum (Mo), Tantalum (Ta), platinum (Pt), titanium silicide (TiSi), Tantalum silicide (TaSi), titanium tungsten (TiW), titanium oxide nitride (TiON), titanium lo aluminum oxide nitride (TiAlON), tungsten oxide nitride (WON), tantalum oxide nitride (TaON), iridium oxide ($IrO_2$), and admixtures thereof. The heater material may also comprise a metal, allow, metallic oxide, metallic nitride, oxide electrode, conductance carbon compound, and admixture thereof.

The first word line contact is preferably formed to be higher than the phase change layer.

In another aspect of the present invention, a method of manufacturing a phase change memory device forming a first (i.e., lower) metal silicide film on a surface of an active area of a silicon substrate; forming a first interlayer dielectric on the silicon substrate having the first metal silicide film; forming vertical PN diodes as a plurality of switching elements in contact with the active area in the first interlayer dielectric; forming a second (i.e., upper) metal silicide film on a surface of the vertical PN diodes; forming a second interlayer dielectric on the first interlayer dielectric having the second metal silicide film; forming a heater in contact with each of the vertical PN diodes in the second interlayer dielectric; forming a stack pattern of a phase change layer and an top electrode on the heater; forming a third interlayer dielectric on the second interlayer dielectric to cover the stack pattern; etching the third interlayer dielectric so that a surface of the first metal silicide film at each of both sides of the active area is exposed, thus forming a first contact hole; forming a first word line contact by filling a conductive materials in the first contact hole; forming a fourth interlayer dielectric on the third interlayer dielectric having the first word line contact; forming a second word line contact to contact with the first word line contact and forming an top electrode contact to contact with the top electrode in the fourth interlayer dielectric; forming a bit line on the top electrode contact; forming a fifth interlayer dielectric on the fourth interlayer dielectric having the bit line; forming a third word line contact into contact with the second word line contact in the fifth interlayer dielectric; and forming a word line on the fifth interlayer dielectric having the third word line contact.

Before performing the step forming the metal silicide film on the surface of the active area of the silicon substrate, the method may further comprise the step of conducting the active area to an impurity ion-implanting process.

The first metal silicide film preferably comprises any one selected from the group consisting of a cobalt silicide ($CoSi_2$) film, a nickel silicide ($NiSi_2$) film, a platinum silicide ($PtSi_2$) film, a tungsten silicide ($WSi_2$) film, a molybdenum silicide (MoSi$_2$) film, a tantalum silicide (TaSi$_2$) film, a copper silicide (Cu$_5$Si) film, a vanadium silicide (V$_3$Si) film, an iron silicide (Fe$_3$Si) film, a manganese silicide (Mn$_3$Si) film, a chromium silicide (Cr$_3$Si) film, a uranium silicide (U$_3$Si$_2$) film, a hafnium silicide (HfSi) film, a tantalum silicide (TaSi) film, a potassium silicide (KSi) film, a rubidium silicide (RbSi) film, a cesium silicide (CsSi) film, a titanium silicide (TiSi) film, a zirconium silicide (ZrSi) film, a thallium silicide (ThSi) film, a plutonium silicide (PuSi) film, a calcium silicide (CaSi) film, a strontium silicide (SrSi) film, a yttrium silicide (YSi) film, and admixtures thereof.

The number of switching elements disposed in a cell is preferably about 8~24.

The second metal silicide film preferably comprises any one selected from the group consisting of a cobalt silicide (CoSi$_2$) film, a nickel silicide (NiSi$_2$) film, a platinum silicide (PtSi$_2$) film, a tungsten silicide (WSi$_2$) film, a molybdenum silicide (MoSi$_2$) film, a tantalum silicide (TaSi$_2$) film, a copper silicide (Cu$_5$Si) film, a vanadium silicide (V$_3$Si) film, an iron silicide (Fe$_3$Si) film, a manganese silicide (Mn$_3$Si) film, a chromium silicide (Cr$_3$Si) film, a uranium silicide (U$_3$Si$_2$) film, a hafnium silicide (HfSi) film, a tantalum silicide (TaSi) film, a potassium silicide (KSi) film, a rubidium silicide (RbSi) film, a cesium silicide (CsSi) film, a titanium silicide (TiSi) film, a zirconium silicide (ZrSi) film, a thallium silicide (ThSi) film, a plutonium silicide (PuSi) film, a calcium silicide (CaSi) film, a strontium silicide (SrSi) film, a yttrium silicide (YSi) film, and admixtures thereof.

The heater preferably being made from any one selected from the group consisting of titanium nitride (TiN), silicon germanium (SiGe), titanium aluminum nitride (TiAlN), tungsten (W), titanium (Ti), molybdenum (Mo), Tantalum (Ta), platinum (Pt), titanium silicide (TiSi), Tantalum silicide (TaSi), titanium tungsten (TiW), titanium oxide nitride (TiON), titanium aluminum oxide nitride (TiAlON), tungsten oxide nitride (WON), tantalum oxide nitride (TaON), iridium oxide (IrO$_2$), and admixtures thereof. The heater material may also comprise a metal, allow, metallic oxide, metallic nitride, oxide electrode, conductance carbon compound, and admixture thereof.

The first word line contact is preferably formed to be higher than the phase change layer.

The forming the second word line contact and the forming the top electrode contact are preferably simultaneously performed.

The forming the top electrode contact is performed after forming the second word line contact, or the forming the second word line contact is performed after forming the top electrode contact.

DESCRIPTION OF SPECIFIC EMBODIMENTS

Hereinafter, specific embodiments of the present invention will be described with reference to the accompanying drawings. The drawings are not necessarily to scale and in some instances proportions may have been exaggerated in order to more clearly depict certain features of the invention.

Figure 1:
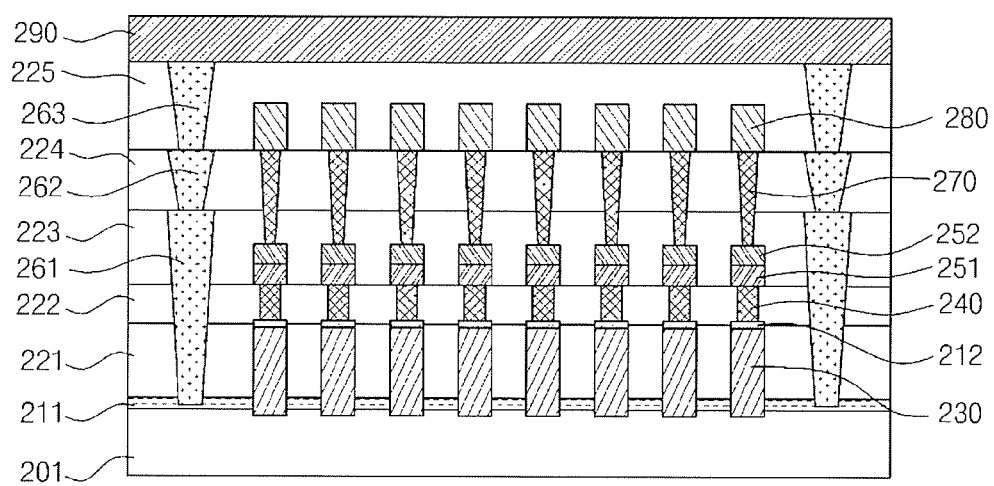
FIG. 1 is a cross-sectional view showing a phase change memory device in accordance with an embodiment of the present invention.

FIG. 1 is a sectional view showing a phase change memory device in accordance with an embodiment of the present invention.

Referring to FIG. 1, a metal silicide film 211, for example, any one selected from the group consisting of a cobalt silicide (CoSi$_2$) film, a nickel silicide (NiSi$_2$) film, a platinum silicide (PtSi$_2$) film, a tungsten silicide (WSi$_2$) film, a molybdenum silicide (MoSi$_2$) film, a tantalum silicide (TaSi$_2$) film, a copper silicide (Cu$_5$Si) film, a vanadium silicide (V$_3$Si) film, an iron silicide (Fe$_3$Si) film, a manganese silicide (Mn$_3$Si) film, a chromium silicide (Cr$_3$Si) film, a uranium silicide (U$_3$Si$_2$) film, a hafnium silicide (HfSi) film, a tantalum silicide (TaSi) film, a potassium silicide (KSi) film, a rubidium silicide (RbSi) film, a cesium silicide (CsSi) film, a titanium silicide (TiSi) film, a zirconium silicide (ZrSi) film, a thallium silicide (ThSi) film, a plutonium silicide (PuSi) film, a calcium silicide (CaSi) film, a strontium silicide (SrSi) film, a yttrium silicide (YSi) film, and admixtures thereof is formed on the surface of an active area 201 of a silicon substrate 200. The active area of the silicon substrate is doped with a dopant.

A switching elements 230, for example, vertical PN diodes are formed to be in contact with the active area 201 having the metal silicide film 211. Preferably, the number of vertical PN diodes disposed in a cell is about 8~24. A heater 212 is formed on each of the switching elements 230, and also, a stack pattern of a phase change layer 251 and an top electrode 252 is formed to be in contact with the heater 212. A first word line contact 261 which is higher than the phase change layer 251, a second word line contact 262 and a third word line contact 253 are formed on the metal silicide film 211 at each of both sides of the active area. A word line 290 is formed to be into contact with the silicon substrate via the third word line contact 263, and a bit line 280 is formed to be into contact with the top electrode 252 via an top electrode contact 270. The bit line 280 is formed in a direction perpendicular to the direction of the active area of the silicon substrate, and the word line 290 is formed in the direction substantially along the direction of the active area of the silicon substrate. The word line 290 can be covered with a fifth dielectric 225.

The phase change memory device according to the embodiment of the present invention includes the metal silicide film preferably formed on the surface of the active area of the silicon substrate.

Hence, the phase change memory device according to the embodiment of the present invention makes possible to realize a reduction in the resistance of the silicon substrate thanks to the presence of the metal silicide film. Thereby, peripheral resistance values affecting the current driving properties of the switching elements are decreased, and thus, the current driving properties of the switching elements may be expected to be improved.

FIGS. 2A to 2H are sectional views showing the process for a method of manufacturing the phase change memory device in accordance with an embodiment of the present invention. The method will be described below.

Figure 2A:
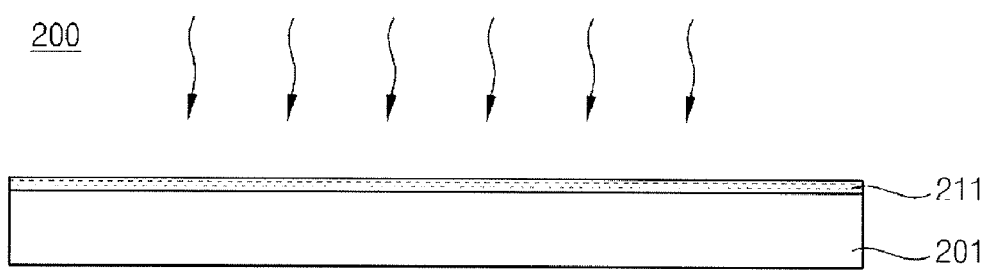
FIGS. 2A through 2H are cross-sectional views showing the process for a method of manufacturing the phase change memory device in accordance with an embodiment of the present invention.

Referring to FIG. 2A, a silicon substrate 200 is prepared having an active area. An impurity area is formed in the active area by ion-implanting impurities into the surface of silicon substrate 200 having the active area 201. Here, a resistance value of the silicon substrate 200 is decreased at the impurity area. Subsequently, the silicon substrate having the impurity area corresponding to the active area 201 undergoes a silicide processes so as to form a first metal silicide film 211. The silicide process may comprise any known silicide fabrication process, for example, selecting any one from the group consisting of a cobalt silicide ($CoSi_2$) film, a nickel silicide ($NiSi_2$) film, a platinum silicide ($PtSi_2$) film, a tungsten silicide ($WSi_2$) film, a molybdenum silicide ($MoSi_2$) film, a tantalum silicide ($TaSi_2$) film, a copper silicide ($Cu_5Si$) film, a vanadium silicide ($V_3Si$) film, an iron silicide ($Fe_3Si$) film, a manganese silicide ($Mn_3Si$) film, a chromium silicide ($Cr_3Si$) film, a uranium silicide ($U_3Si_2$) film, a hafnium silicide (HfSi) film, a tantalum silicide (TaSi) film, a potassium silicide (KSi) film, a rubidium silicide (RbSi) film, a cesium silicide (CsSi) film, a titanium silicide (TiSi) film, a zirconium silicide (ZrSi) film, a thallium silicide (ThSi) film, a plutonium silicide (PuSi) film, a calcium silicide (CaSi) film, a strontium silicide (SrSi) film, a yttrium silicide (YSi) film, and admixtures thereof on the surface of the active area 201.

The first metal silicide film 211 may be formed by any known metal 20 silicide fabrication technique in which it is preferable that the first metal silicide film 211 is formed by depositing a metal film on the silicon substrate. Subsequently a primary heat treatment process is conducted on the silicon substrate having the metal film in which it is then followed by removing any non-reacted metal film which has not reacted with the silicon substrate due to the primary heat treatment. This is then followed by performing a secondary heat treatment which forms the first metal silicide film on the surface of the active area of the silicon substrate. The first metal silicide film may be any known metal silicide film. It is preferred the metal silicide film is selected from the group consisting of a cobalt silicide ($CoSi_2$) film, a nickel silicide ($NiSi_2$) film, a platinum silicide ($PtSi_2$) film, a tungsten silicide ($WSi_2$) film, a molybdenum silicide ($MoSi_2$) film, a tantalum silicide ($TaSi_2$) film, a copper silicide ($Cu_5Si$) film, a vanadium silicide ($V_3Si$) film, an iron silicide ($Fe_3Si$) film, a manganese silicide ($Mn_3Si$) film, a chromium silicide ($Cr_3Si$) film, a uranium silicide ($U_3Si_2$) film, a hafnium silicide (HfSi) film, a tantalum silicide (TaSi) film, a potassium silicide (KSi) film, a rubidium silicide (RbSi) film, a cesium silicide (CsSi) film, a titanium silicide (TiSi) film, a zirconium silicide (ZrSi) film, a thallium silicide (ThSi) film, a plutonium silicide (PuSi) film, a calcium silicide (CaSi) film, a strontium silicide (SrSi) film, a yttrium silicide (YSi) film, and admixtures thereof.

Even though the process of doping the active area with the dopant as above may reduce the resistance of the resultant silicon substrate, the degree of the reduction in the resistance of the silicon substrate using a doping process simply has its own finite limits. In the present invention, the first metal silicide film is formed on the surface of the active area doped with the dopant, which makes it possible to realize a reduction in the resistance value of the silicon substrate to about $10\Omega$.

Figure 2B:
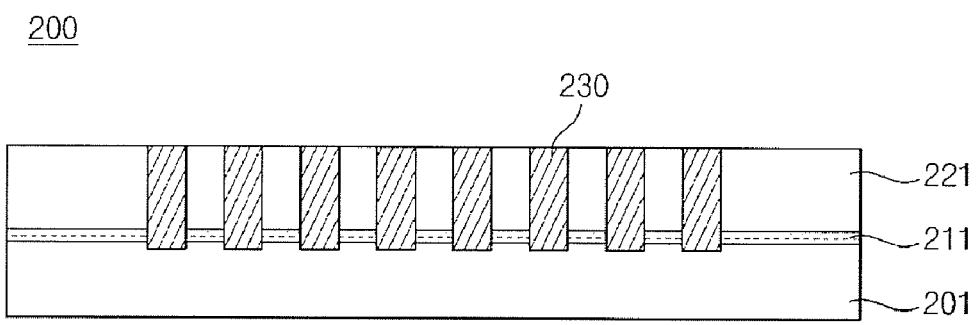

Referring to FIG. 2B, a first interlayer dielectric 221 is shown formed on the entire surface of the silicon substrate 200 having the first metal silicide film 211. Subsequently the first interlayer dielectric 221 is selectively etched so as to define a plurality of holes through the first interlayer dielectric 221 so that the surface of active area is exposed. Thereafter, a selective epitaxial growth (SEG) process is conducted on the silicon substrate 200 having the plurality of holes so as to form an N-type silicon layer within the holes. Subsequently, a P-type ion-implanting process is conducted on an upper portion of the N-type silicon layer so as to form vertical PN diodes 230. Accordingly, these vertical PN diodes 230, formed in the holes, can be used as vertically aligned switching elements for the resultant phase change memory device.

The number of PN diodes disposed in each cell may be any integral number and should not be limited to any particular number per cell. However, it is preferable that the number be within about 8~24. Even more preferable, the number of PN diodes disposed in each cell may be in multiples of 8.

Here, it is possible to reduce the resistance value across the active area 201 of the silicon substrate 201 which affects the current driving properties of the vertical PN diodes by employing the first metal silicide film 211. Thus, as compared to more conventional current driving configurations of these devices, the vertical PN diodes 230 of the present invention provide superior current performance.

Figure 3:
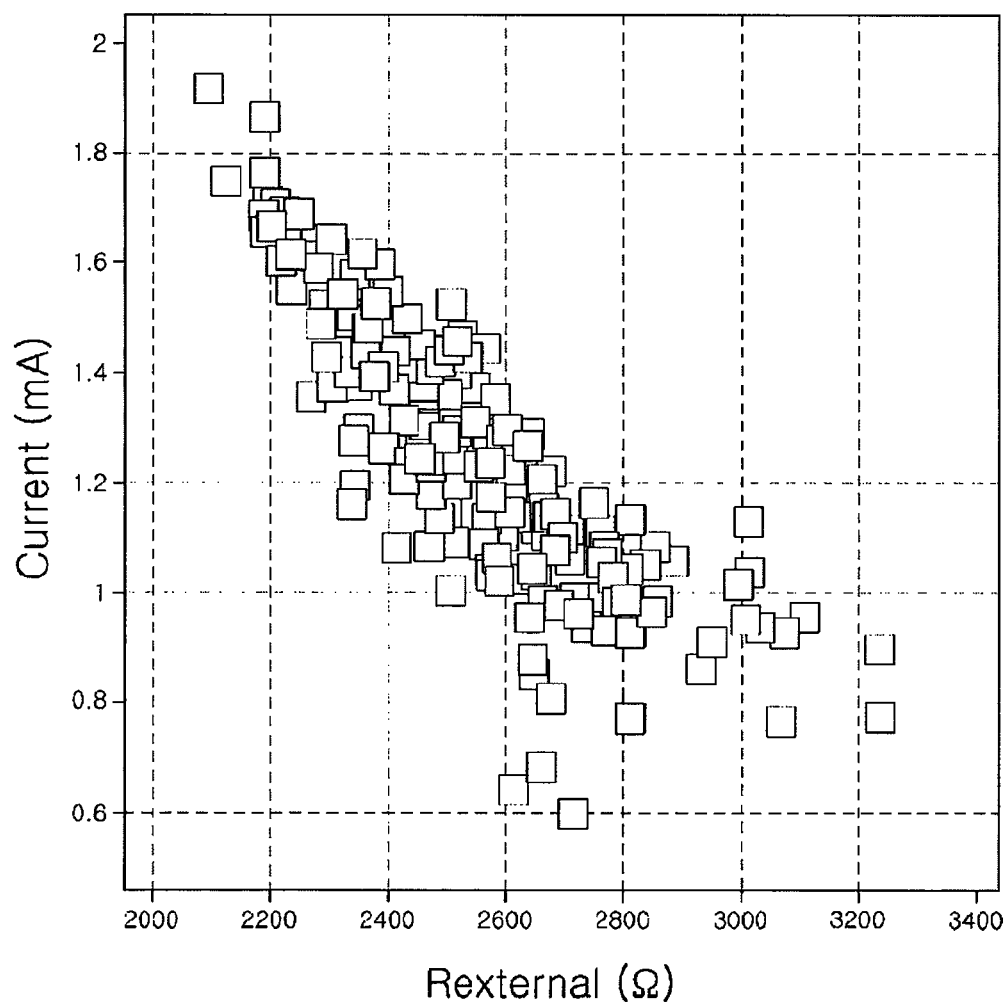
FIG. 3 is a graph showing current properties of vertical PN diodes depending on the peripheral resistance values.

Referring now to FIG. 3 which is a graph showing empirical driving currents (mA) of the some vertical PN diodes as a function of their respective peripheral resistance values (Rexternal).

As is apparent from this drawing in FIG. 3, as the peripheral resistance values of the vertical PN diodes decreases, the current properties of the vertical PN diodes can be seen to be improved. It should be noted that the peripheral resistance values of the vertical PH diodes includes the resistance of the silicon substrate as well as the interfacial contact resistance across the Metal silicide film and the PN diode.

Further, as the resistance value of the silicon substrate is reduced, it is noted that little or no differences in the current magnitude and in the current density of the driving currents between adjacent vertical PN diodes occurred. Accordingly the number of vertical PN diodes per cell may be increased without adversely affecting the performance of the resultant phase change memory device.

Specifically, the driving current differences between adjacent PN diodes varies depending on the resistance value of the silicon substrate. As the number of PN diodes is increased, the difference in current between the PN diodes disposed in the center of the substrate and the PN diodes disposed at the sides thereof is increased. In the present invention, the process of forming the first metal silicide film on the surface of the active area is performed. This first metal silicide film substantially aids in reducing the resistance value of the silicon substrate and thus substantially aids in reducing any difference in the driving currents between adjacent PN diodes. As a result, all of the PN diodes per cell can be considered to be nearly equivalent to one another because their respective driving currents are nearly the same. Hence, the number of PN diodes per cell is no longer a limiting factor and as a result a very high degree of integration thereof can be realized from the phase change memory device of the present invention.

Figure 2C:
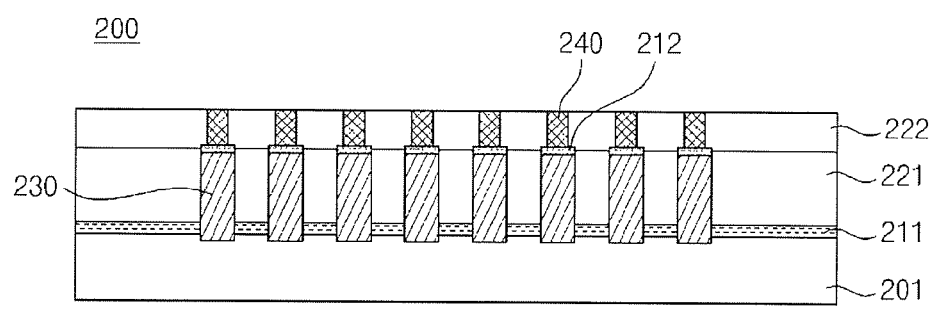

Referring now to FIG. 2C, another silicide processes is conducted on the silicon substrate, now having the vertical PN diodes 230, so as to form a second metal suicide film 212 directly on the vertical PN diodes 230. As before, the metal silicide process may be any known metal silicide fabrication process and may use any metal silicide. It is preferred that the metal silicide film formed is any one selected from the group consisting of a $CoSi_2$ film, a $NiSi_2$ film, a $PtSi_2$ film, a $WSi_2$ film, a $MoSi_2$ film, a $TaSi_2$ film, and admixtures thereof. Here, The silicide process for forming the second metal silicide film 212 can be performed in the substantially same manner as in the above silicide process that formed the first metal silicide film. As a result of implementing this process to form the second metal silicide film 212 on the vertical PN diodes 230, the contact resistance is substantially reduced and thereby the performance of the vertical PH diodes 230 is enhanced.

Then, a second interlayer dielectric 222 is deposited on the first interlayer dielectric 221 and on the second metal silicide film 212. The second interlayer dielectric 222 is subsequently selectively etched to define heater holes through the second interlayer dielectric 222 to expose portions of the underlying second metal silicide film 212. Afterwards the heater contact holes are filled with a conductive material so as to form a plurality heaters 240 in contact with their respective vertical PN diodes 230. The heaters 240 may be made of any material, in particular it is preferred that the heaters 240 are made of material that has a relatively high resistivity, as well as being formed of a material that has a relatively high heat transfer efficiency. Some preferred materials for use in forming the heaters 240 may be those selected from the group consisting of titanium nitride (TiN), silicon germanium (SiGe), titanium aluminum nitride (TiAlN), tungsten (W), titanium (Ti), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), carbon (C), molybdenum (Mo), Tantalum (Ta), platinum (Pt), titanium silicide (TiSi), Tantalum silicide (TaSi), titanium tungsten (TiW), titanium oxide nitride (TiON), titanium aluminum oxide nitride (TiAlON), tungsten oxide nitride (WON), tantalum oxide nitride (TaON), iridium oxide ($IrO_2$), and admixtures thereof. Some most preferred materials for use in forming the heaters 240 may be those selected from the group consisting of titanium nitride (TiN), silicon germanium (SiGe), titanium aluminum nitride (TiAlN), tungsten (W), titanium (Ti), and admixtures thereof. The heater material may also comprise a metal, alloy, metallic oxide, metallic nitride, oxide electrode, conductance carbon compound, and admixture thereof.

Figure 2D:
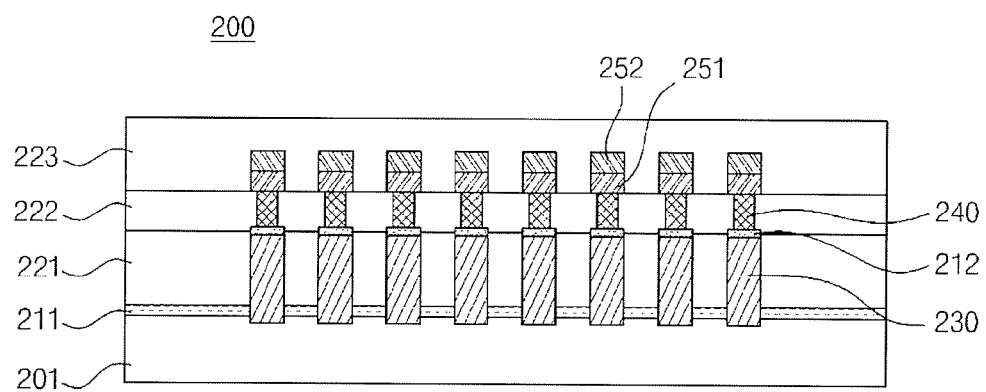

Referring to FIG. 2D, a phase change material and top electrode material are sequentially deposited on the second interlayer dielectric 222 and on the heaters 240. This phase change layer and the top electrode material are then selective etched to form stack patterns of the phase change layer 251 and top electrodes 252 on the heaters 240. The phase change layer 251 may be composed of known phase change material or alloy. It is preferred that the phase change layer 251 is formed of an alloy containing one or more selected from the group consisting of Te, Se, Ge, Sb, Bi, Pb, Sn, As, S, Si, P and O. After the phase change layer 251 and top electrodes 252 are formed on the heaters 240, a third interlayer dielectric 223 is formed on the second interlayer dielectric 222 and on the phase change layer 251 on the top electrodes 252.

Figure 2E:
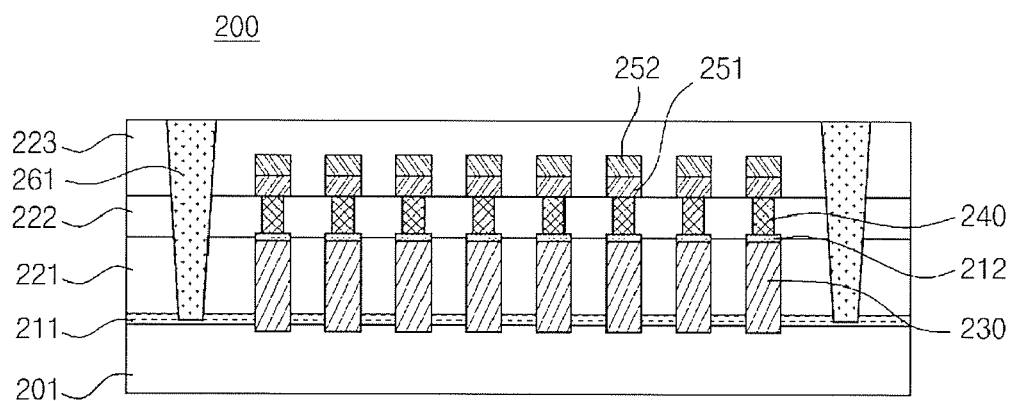

Referring to FIG. 2E, the third interlayer dielectric 223, the second interlayer dielectric 222 and the first interlayer dielectric 221 are selectively etched to define first contact holes that expose portions of the first metal silicide film 211. It is preferred that the first contact holes are formed along both sides of the active area. Then, in a state in which the silicide process lo for forming the silicide film on the surface of the first contact holes is skipped, the first contact holes are filled in with a conductive material to eventually form the first word line contacts 261. The first word line contacts 261 are preferably formed to be at a higher level than the phase change layer.

Here, the reason why the silicide process for forming the silicide film on the surface of the first contact holes after formation of the first contact holes is skipped is that the first metal silicide film 211 is formed on the surface of the active area before formation of the first contact holes. Because of this the silicide process which is used for reducing resistance of the first word line contact may be skipped. In the course of forming the first word line contact, the silicide process for reducing contact resistance is skipped, and thereby, the first word line contact 261 may be made from a single layer.

Conventionally, in a method of manufacturing a phase change memory device in the conventional art, because the melting point of the phase change layer is low, the high-temperature silicide process cannot be performed in a state in which the phase change layer was first formed. Hence, the word line contact accompanied by the silicide process is provided in the form of a double layer. Specifically, the word line contact requiring the suicide process is first formed before the formation of the phase change layer, after which the phase change layer is formed, and then the word line contact is provided in a stack form.

In the present invention, because the process of forming the word line contact is performed in a state in which the first metal silicide film is formed on the surface of the active area, the word line contact can be formed from a single layer at the point of time at which the phase change layer is formed. Thereby the present invention can realizes a more simplified manufacturing process.

Figure 2F:
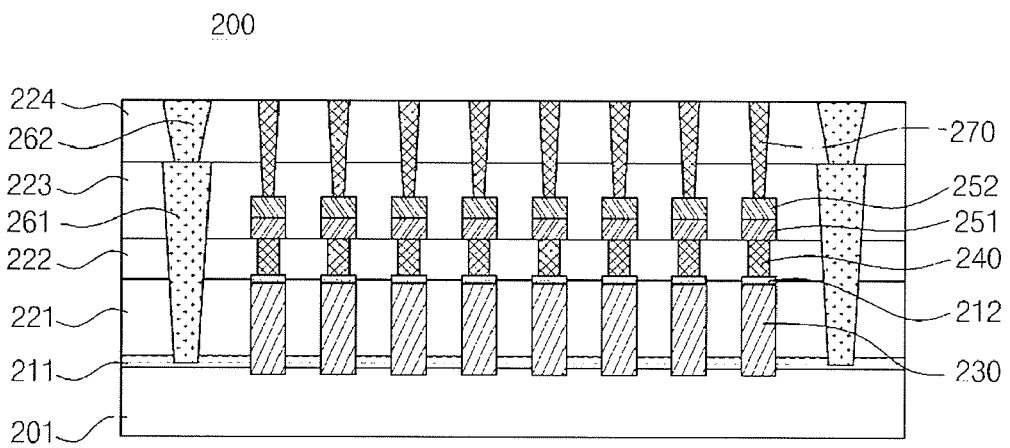

Referring to FIG. 2F, a fourth interlayer dielectric 224 is formed on the third interlayer dielectric 223 and on the first word line contacts 261. Afterwards the fourth interlayer dielectric 224 and the third interlayer dielectric 223 are selectively etched to define top electrode contact holes that expose the surface of the top electrodes 252. Subsequently, the top electrode contact holes are filled in with a conductive material so as to form the top electrode contacts 270 that electrically contact with the top electrodes 252. Thereafter, the fourth interlayer dielectric 224 is selectively etched to define second contact holes that expose the surface of the first word line contacts 261. Subsequently, the second contact holes are filled in with a conductive material to form respectively second word line contacts 262 on the first word line contacts 261. Here, the top electrode contacts 270 and the second word line contacts 262 may be formed at the same time, or alternatively, the second word line contacts 262 and then the top electrode contacts 270 may be formed at different stages.

Figure 2G:
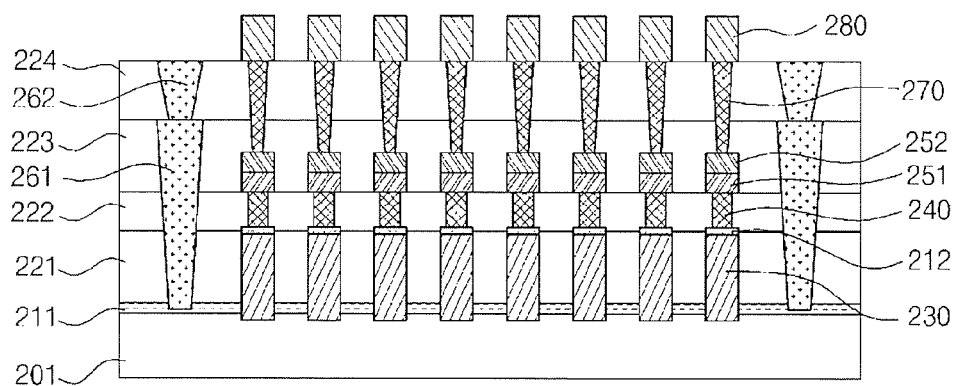

Referring to FIG. 2G, a bit line material is shown deposited on the fourth interlayer dielectric 224 and on the top electrode contacts 270 and on the second word line contacts 262. Afterwards the bit line material is selectively etched to form bit lines 280 in contact with the top electrode contacts 270. Here, the bit lines 280 are formed in a direction substantially perpendicular to the direction of the active area of the silicon substrate.

Figure 2H:
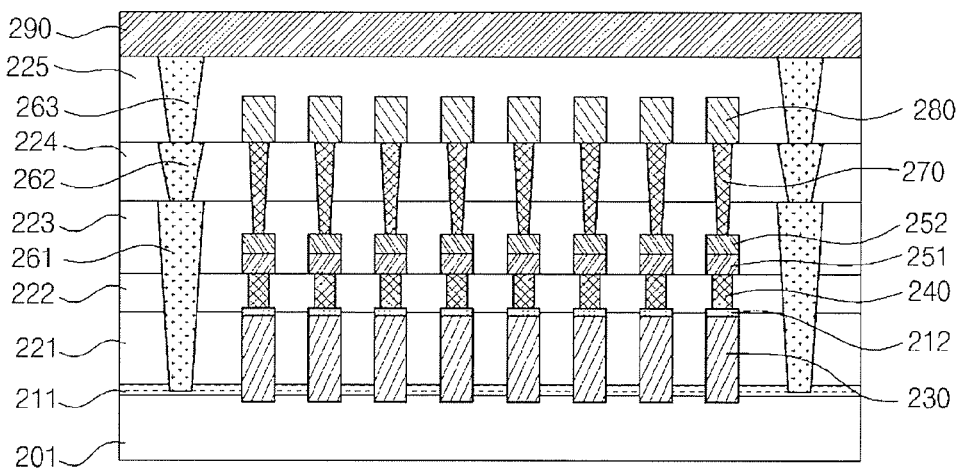

Referring to FIG. 2H, a fifth interlayer dielectric 225 is shown deposited on the fourth interlayer dielectric having the bit lines 280. Afterwards the fifth interlayer dielectric 225 is selectively etched to form third contact holes that expose the surface of second word line contacts. Subsequently, the third contact holes are filled in with a conductive material to form a respectively third word line contacts 263 on the second word line contacts 262. Afterwards, a word line material is deposited on the fifth interlayer dielectric 225 having the third word line contacts 263, and is then selectively etched to form word lines 290 in contact with the third word line contacts. The word line 290 is formed in the direction of the active area of the silicon substrate.

Although not shown, a series of subsequent procedures which are known in the art are sequentially performed, thus completing the phase change memory device according to the present invention.

As described above, while the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:
1. A method of manufacturing a phase change memory device comprising:

forming a first metal silicide film on a surface of an active area of a silicon substrate;

forming a first interlayer dielectric on the first metal silicide film;

forming vertical PN diodes in the first interlayer dielectric, the vertical PN diodes in electrical contact with the active area in the first interlayer dielectric, wherein the PN diodes are used as switching elements;

forming a second metal silicide film on a surface of the vertical PN diodes;

forming a second interlayer dielectric on the first interlayer dielectric and on the second metal silicide film;

forming heaters in contact with each of the vertical PN diodes in the second interlayer dielectric;

forming stack patterns on the heater, the stack patterns comprising a phase change layer and a top electrode;

forming a third interlayer dielectric on the second interlayer dielectric covering the stack patterns;

etching selectively the third interlayer dielectric to form first contact holes that expose a surface of the first metal silicide film at each of both sides of the active area;

forming first word line contacts by filling the first contact hole with a conductive material;

forming a fourth interlayer dielectric on the third interlayer dielectric and on the first word line contacts;

forming second word line contacts that electrically contact with the first word line contacts and forming top electrode contacts into the fourth interlayer dielectric to electrically contact the top electrodes;

forming bit lines on the top electrode contacts;

forming a fifth interlayer dielectric on the fourth interlayer dielectric and on the bit lines;

forming third word line contacts in the fifth interlayer dielectric to electrically contact with the second word line contacts; and forming word lines on the fifth interlayer dielectric and on the third word line contacts.

2. The method according to claim 1, further comprising the step of ion-implanting an impurity into the active area, wherein the ion-implanting step is performed before the step of forming the metal silicide film on the surface of the active area of the silicon substrate.

3. The method according to claim 1, wherein the first metal silicide film comprises any one selected from the group consisting of a cobalt silicide ($CoSi_2$) film, a nickel silicide ($NiSi_2$) film, a platinum silicide ($PtSi_2$) film, a tungsten silicide ($WSi_2$) film, a molybdenum silicide ($MoSi_2$) film, a tantalum silicide ($TaSi_2$) film, a copper silicide ($Cu_5Si$) film, a vanadium silicide ($V_3Si$) film, an iron silicide ($Fe_3Si$) film, a manganese silicide ($Mn_3Si$) film, a chromium silicide ($Cr_3Si$) film, a uranium silicide ($U_3Si_2$) film, a hafnium silicide (HfSi) film, a tantalum silicide (TaSi) film, a potassium silicide (KSi) film, a rubidium silicide (RbSi) film, a cesium silicide (CsSi) film, a titanium silicide (TiSi) film, a zirconium silicide (ZrSi) film, a thallium silicide (ThSi) film, a plutonium silicide (PuSi) film, a calcium silicide (CaSi) film, a strontium silicide (SrSi) film, a yttrium silicide (YSi) film, and admixtures thereof.

4. The method according to claim 1, wherein a number of the switching elements disposed in a cell is in the range of 8 ~24.

5. The method according to claim 1, wherein the second metal silicide film comprises any one selected from the group consisting of a cobalt silicide ($CoSi_2$) film, a nickel silicide ($NiSi_2$) film, a platinum silicide ($PtSi_2$) film, a tungsten silicide ($WSi_2$) film, a molybdenum silicide ($MoSi_2$) film, a tantalum silicide ($TaSi_2$) film, a copper silicide ($Cu_5Si$) film, a vanadium silicide ($V_3Si$) film, an iron silicide ($Fe_3Si$) film, a manganese silicide ($Mn_3Si$) film, a chromium silicide ($Cr_3Si$) film, a uranium silicide ($U_3Si_2$) film, a hafnium silicide (HfSi) film, a tantalum silicide (TaSi) film, a potassium silicide (KSi) film, a rubidium silicide (RbSi) film, a cesium silicide (CsSi) film, a titanium silicide (TiSi) film, a zirconium silicide (ZrSi) film, a thallium silicide (ThSi) film, a plutonium silicide (PuSi) film, a calcium silicide (CaSi) film, a strontium silicide (SrSi) film, a yttrium silicide (YSi) film, and admixtures thereof.

6. The method according to claim 1, wherein the heaters are made of material that comprises any one selected from the group consisting of titanium nitride (TiN), silicon germanium (SiGe), titanium aluminum nitride (TiAlN), tungsten (W), titanium (Ti), molybdenum (Mo), Tantalum (Ta), platinum (Pt), titanium silicide (TiSi), Tantalum silicide (TaSi), titanium tungsten (TiW), titanium oxide nitride (TiON), titanium aluminum oxide nitride (TiAlON), tungsten oxide nitride (WON), tantalum oxide nitride (TaON), iridium oxide ($IrO_2$), and admixtures thereof.

7. The method according to claim 1, wherein the first word line contacts are formed higher relative to the phase change layers.

8. The method according to claim 1, wherein the steps of forming the second word line contacts and the forming the top electrode contacts are simultaneously performed.

9. The method according to claim 1, wherein the step of forming the top electrode contacts is performed after the step of forming the second word line contact, or the step of forming the second word line contacts is performed after the step forming the top electrode contacts.

* * * * *